United States Patent [19]

Ho

[11] 4,254,445

[45] Mar. 3, 1981

[54] DISCRETIONARY FLY WIRE CHIP INTERCONNECTION

[75] Inventor: Chung W. Ho, Chappaqua, N.Y.

[73] Assignee: International Business Machines Corporation, Armonk, N.Y.

[21] Appl. No.: 36,946

[22] Filed: May 7, 1979

[51] Int. Cl.³ .................................................. H05K 1/18
[52] U.S. Cl. .................................. 361/392; 361/403; 361/409; 174/68.5
[58] Field of Search ................ 361/403, 409, 406, 414, 361/392; 174/68.5

[56] References Cited

U.S. PATENT DOCUMENTS

| | | | |
|---|---|---|---|
| 3,072,734 | 1/1963 | Fox | 174/68.5 |
| 3,474,297 | 10/1969 | Bylander | 174/68.5 X |
| 3,478,425 | 11/1969 | Cooke | 174/68.5 X |
| 3,496,419 | 2/1970 | Sakellakis | 361/409 |
| 3,562,592 | 2/1971 | Cooke | 174/68.5 X |
| 3,717,800 | 3/1973 | Thillays | 174/68.5 X |
| 3,777,221 | 12/1973 | Tatsuko | 361/401 |
| 3,795,974 | 3/1974 | Calhoun | 29/578 X |
| 3,803,483 | 4/1974 | McMahon | 361/409 X |
| 3,895,181 | 7/1975 | LaGrange | 361/409 X |
| 3,917,984 | 11/1975 | Kong | 361/403 |

FOREIGN PATENT DOCUMENTS 2810575 9/1978 Fed. Rep. of Germany ......... 174/68.5

OTHER PUBLICATIONS

Ho et al., Planar Wiring Repair Technique for the Thin-Film Metal Package via Solder Evaporation, IBM Tech. Bull., V. 20, #9, 02/78.

*Primary Examiner*—Richard R. Kucia
*Attorney, Agent, or Firm*—Graham S. Jones, II

[57] ABSTRACT

A module for LSI chips includes an orthogonal array of sets of pads and fan-out metallization for a large number of chips. Running parallel to the sides of the chips and the fan-out area are several parallel prefabricated, thin film engineering change interconnection lines terminating in pads adjacent to the fan-out. The pads are arranged to permit discretionary connections of the fan-out pads to the engineering change pads with minimal crossovers by means of short fly wires. A staggered pad arrangement minimizes potential crossovers and maximizes the number of interconnection lines that can be fabricated.

9 Claims, 7 Drawing Figures

DISCRETIONARY FLY WIRE CHIP INTERCONNECTION

Description

1. Technical Field

This invention relates to metal working in making of high-speed semiconductor packages and relates to thin film interconnection lines therefor and more particularly to the repair of defective interconnection lines or to improve the engineering design of the packaging device. In another aspect, it involves the securing of electrical devices into electrical circuits. In any event, the invention relates to joining of one conductor to another conductor or terminal or interconnecting terminals with conductors.

2. Background Art

In the past, engineering changes in semiconductor packages have required use of complex techniques to make connections which involved using discrete wires on the back side of cards and boards or simply by using fly wires to connect from point-to-point on the top side of the module. Fly wires are difficult to use where the dimensions of the packages are very small. In future VLSI circuits dimensions will become far smaller and the removal of insulation from the ends of small fly wires is becoming extremely inefficient in terms of fabrication labor cost when preparing the engineering change (EC) wires for soldering to points to which they are to be secured. Furthermore, the electrical couplings for the adjacent EC wires on the module will be too large for the future VLSI high-speed circuits to tolerate if the presently practiced single, discrete fly wires scheme connecting from point-to-point is continued.

Ho et al, "Planar Wiring Repair Technique for the Thin-film Metal Package via Solder Evaporaion," IBM Technical Disclosure Bulletin 20, No. 9, pp3729-3730 (Feb. 1978) shows a multiple chip package upon which many chips are to be secured with a fan-out area about each chip including pads for testing and engineering changes. About the periphery of the fan-out area is disposed an array of split circle junction forming elements which can be connected on a local basis to connect from point-to-point very locally about the periphery of the single chip. Evaporation of metal is used to connect from one such split circle to another to form a chain. A mask must be used to connect the split circles by evaporation of metal only where the split circles are to be joined.

U.S. Pat. No. 3,766,308 of Loro entitled, "Joining Conductive Elements on Microelectronic Devices," shows use of split adjacent pads of malleable metal in a similar way to connect adjacent wires by means of a cold weld between the metal of the two pad induced by means of pressure. At column 2, line 25 to the end of the paragraph, that patent discusses the technique of joining metal areas separated by small gaps by using vacuum deposition of metal through masks to provide metallic bridges over the small gaps. The disadvantages stated there were high cost and complexity of mask fabrication, mask yield, processing yield, and accumulation of processing damage on a pretested wafer. Thus, the use of stencils seems to be very cumbersome, particularly when the dimensions involved become very small. Ecker et al, "Semiconductor Package Structure," IBM Technical Disclosure Bulletin 20, No. 8, pp. 3092-3093 (Jan. 1978) shows provision of multilayer metallization packages composed of a ceramic glass or resin variety of substrate upon which a number of layers of conductor metallurgy directed in different directions on different levels such as x and y directions is made. U.S. Pat. Nos. 3,795,974 of Calhoun and 3,520,052 of Hoffmann suggest the use of fly wires to connect pads either adjacent to each other in Hoffmann or variably spaced in Calhoun.

An object of this invention is to provide a packaging scheme wherein the engineering change metallurgy is located upon the top surface of the substrate upon which the chips are mounted and which can be utilized to perform engineering changes with minimal expense, maximum flexibility, and greatest assurance of elimination of loss of chips.

BRIEF DESCRIPTION OF THE DRAWINGS

In the accompanying drawings forming a material part of this disclosure.

FI G. 5A is a plan view of a modified system of interconnection lines adjacent to a chip with the use of a wasp waist design of the interconnection lines in the space between a pair of chips in order to minimize the crossover of fly wires joined to the fan-out metallurgy and the pads of the interconnection lines.

DISCLOSURE OF INVENTION

For further comprehension of the invention and of the objects and advantages thereof, reference will be had to the following description and accompanying drawings and to the appended claims in which the various novel features of the invention are more particularly set forth.

Figure 1:
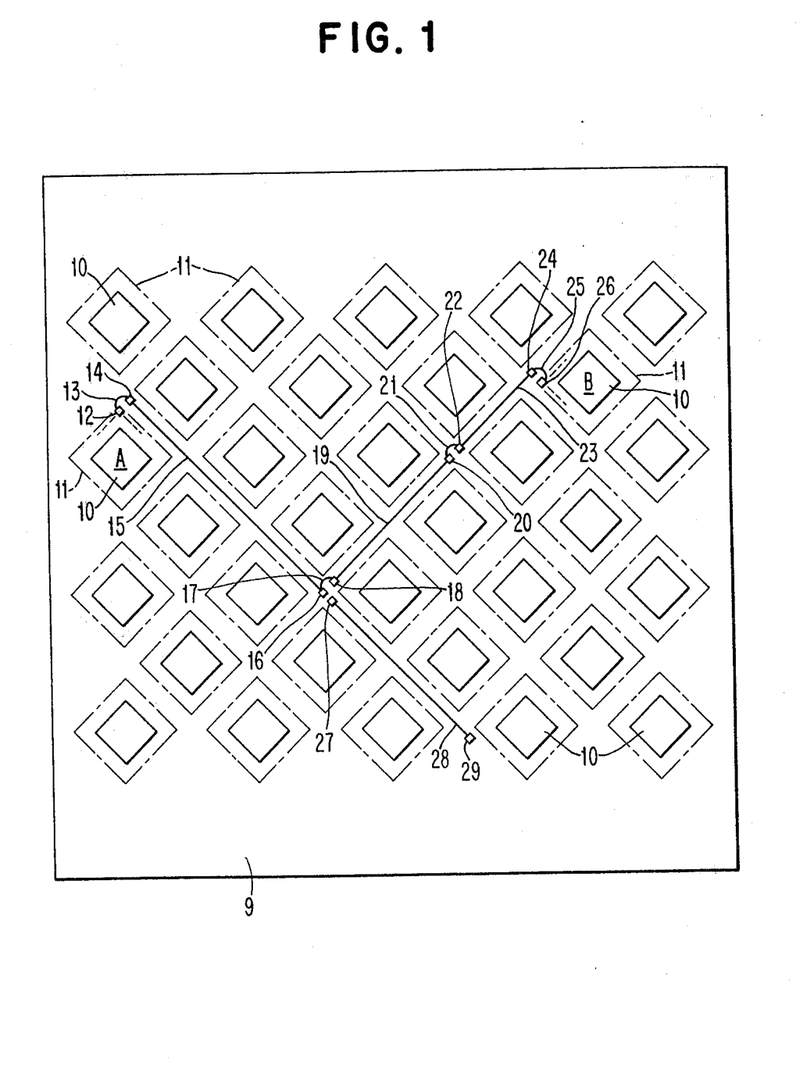
FIG. 1 is a plan view of a substrate upon which a plurality of chips are secured in a plurality of diagonal arrays with prefabricated, thin film engineering change interconnection line metallurgy deposited between the areas assigned to the chips for testing pads and engineering change pads.

Referring to FIG. 1, a package which comprises a substrate 9 upon which is mounted an array of microcircuit chips 10 about each of which is a larger square peripheral area 11 for the fan-out of connections to pads for engineering change connections and for testing. A number of prefabricated thin film interconnection EC lines 15, 28, 19 and 23 of varied length extending in the rows and columns formed between the peripheral areas 11 surrounding the chips 10. The printed wire interconnection EC lines and pads are designed to have different lengths and they are laid out so that the engineering change pads for different chips can be interconnected easily in a manner selected at the discretion of the designed making the engineering changes. This scheme also facilitates interconnections with minimum crossovers. Since the chips are aligned in straight rows, there are straight line paths along which the EC lines are formed. (Such straight line arrays are not necessary to the invention, but are simpler to explain and understand. In fact, it would be typical to have numerous narrow EC lines in parallel extending between each of the rows and columns of chips).

In this application the columns are vertical or along the direction of EC line 15 in FIG. 1, and the rows are horizontal on the page from the bottom of the figure or along line 19 in FIG. 1.

Assume that a connection from chip A to chip B is defective and must be improved by means of an external connection. First of all the two chips have engineering change pads associated therewith which would be used to make the necessary connection. Using conventional technology with fly wires, a wire could be connected from pad 12 in the peripheral area 11 about chip A directly to pad 26 on the peripheral area 11 about chip B. The engineering change wire would be ultrasonically bonded to an engineering change pad. The wire is typically about 0.06 mm diameter Cu wire and the pads are about 0.3 mm square. When the engineering change pads are as long as a few inches, the wires have to bent to fit into an engineering change channel region. Thus, the pads in such a design must be able to withstand a considerable mechanical stress. With microcircuits, such a procedure would be unacceptable because the length of the wire and the space it would require would be inappropriate. Such a wire would be too bulky and would not have the correct resistance value. In addition, such a wire would add significantly to the inductance of the system.

In this case, EC lines 15 in the third column from the left, line 19 and line 23 in the fourth row from the top provide direct communication between the two pads 12 and 26 except for the fact that as originally deposited, those EC lines were not electrically connected but were laid out in advance for the purpose of permitting their use in the event that it should be desired to make a connection between any two points which could not be determined prior to the time that the metallization for the package would have to be manufactured. Accordingly, the EC lines are auxiliary, which permits one to make engineering changes. Then, since the EC lines terminate in pads, the pads are connected by fly wires. EC line 15 terminates at the top end in pad 14 which is connected electrically to pad 12 by fly wire 13. The opposite end of EC wire 15 terminates in pad 16 which is connected by fly wire 17 to pad 18 on the left end of EC wire 19 which is connected on its right end to pad 20 which is finally connected by fly wire 21 to pad 22 which connects via line 23 to pad 24 connected by fly wire 25 to pad 26. Thus, the desired lead to chip A and the lead to chip B (not shown) are connected by the above series of very short connections from pad 12 to pad 26. To illustrate the wire connections more fully, line 28 is shown with its pads 27 and 29 on opposite (top and bottom) ends.

As can be seen from the above description, the fly wires are useful both to connect the engineering change pads to the printed circuit EC lines and to provide crossovers across very short distances. The mechanical tension in the wire is much reduced and the wires need not be insulated. This eliminates the time consuming and costly procedure of removing insulation from the wires which is required when using conventional engineering change processes of applying fly wires. The thin film wires are very narrow (0.5 mil or 0.012 mm) so that large numbers of interconnection lines can be fit into the spaces between the peripheral areas 11 about the chips 10. The thin film wires have a controlled amount of high resistance and have no resistive terminators in order to provide high-speed pulse propagation but also minimize the multiple reflections in the transmission line systems as described in U.S. patent application Ser. No. 920,914 by C. W. Ho for a "Thin Film Lossy Line Package." Within the substrate 9, well below the surface seen in FIG. 1 are several layers of metallization which are used by means of standard electrical vias to provide electrical connections to the C-4 solder balls beneath the chips 10 or to the fan-out pads. In some cases, the lower layers comprise horizontal and vertical wiring planes from the point of view of FIG. 1 parallel to the top surface of substrate 9. The horizontal and vertical wiring planes are separated as will be well understood by those skilled in the art in order that there should be no short circuits. The printed engineering change EC lines 15 and 19, etc. and the chips 10 are arranged at a 45° angle with respect to the substrate edges so that the vertical inductive coupling between the engineering change (EC) interconnection lines and the x-y plane wiring should be kept to a minimum.

Figure 2:
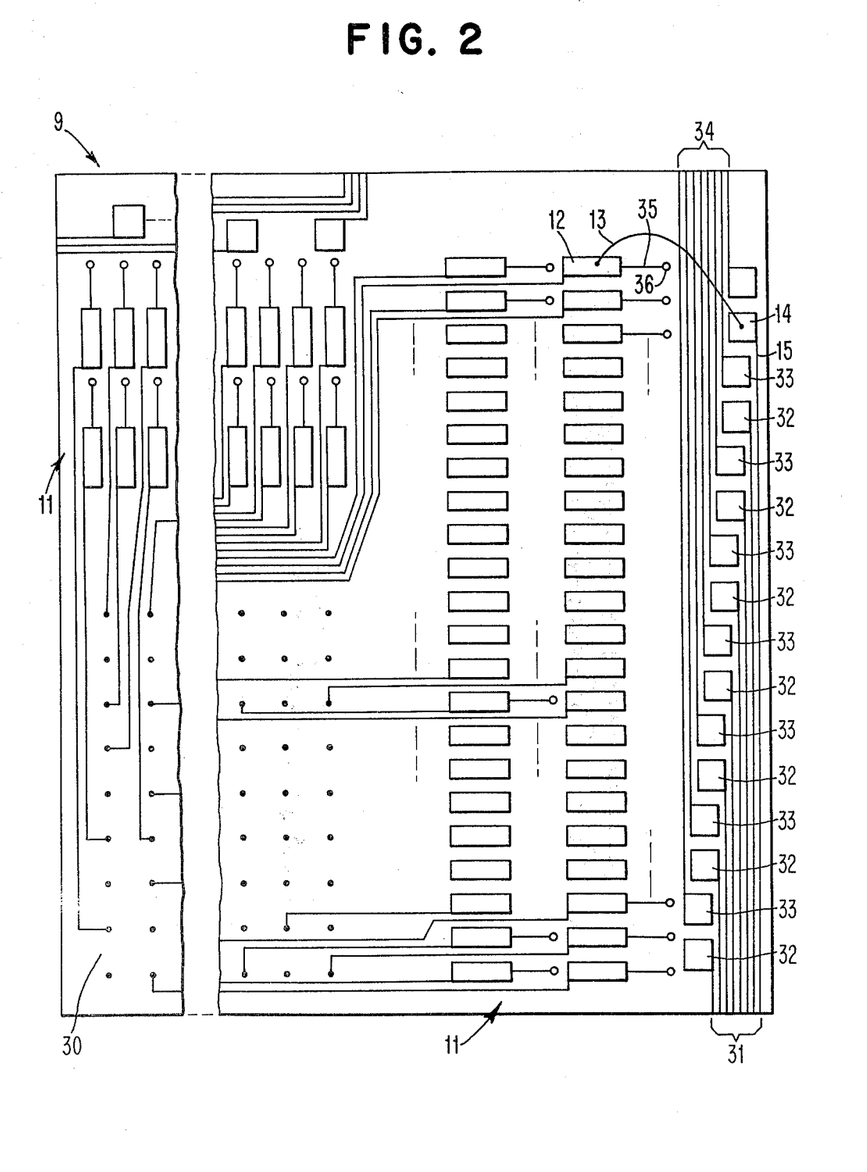
FIG. 2 is a magnified plan view of a small portion of the substrate of FIG. 1 with a chip removed and the solder connection points of one corner of the chip shown as well as the pads adjacent to the edge of the chip and the engineering change interconnection lines adjacent to the edge of the fan-out.

FIG. 2 shows the upper right corner of the area about one of the chips, chip A, which has been removed in order that the locations of the C-4 solder ball connection area 30 and the metallurgy of the fan-out wiring connections could be illustrated. Further, the engineering change pads to which the fan-out metallurgy is connected is also shown. The input/output terminals of a chip can also be accessed for testing by connection of test elements to the pads. Pad 12 is shown connected by fly wire 13 to pad 14. Pad 14 is connected to EC line 15 which is shown to be in a bundle of engineering change EC lines 31 with pads 32 including pad 14 which butt ends with pads 33 of wires 34 so that connections can be made in several ways (e.g., top to bottom, etc.) at discretion. Note that pad 12 is connected by wire 35 to a via 36. It should also be noted that wires such as wire 35 are adapted to be deleted by laser cutting or other mechanical or thermal cutting techniques in order to facilitate an entire engineering change.

Best Mode of Carrying out the Invention

Figure 3:
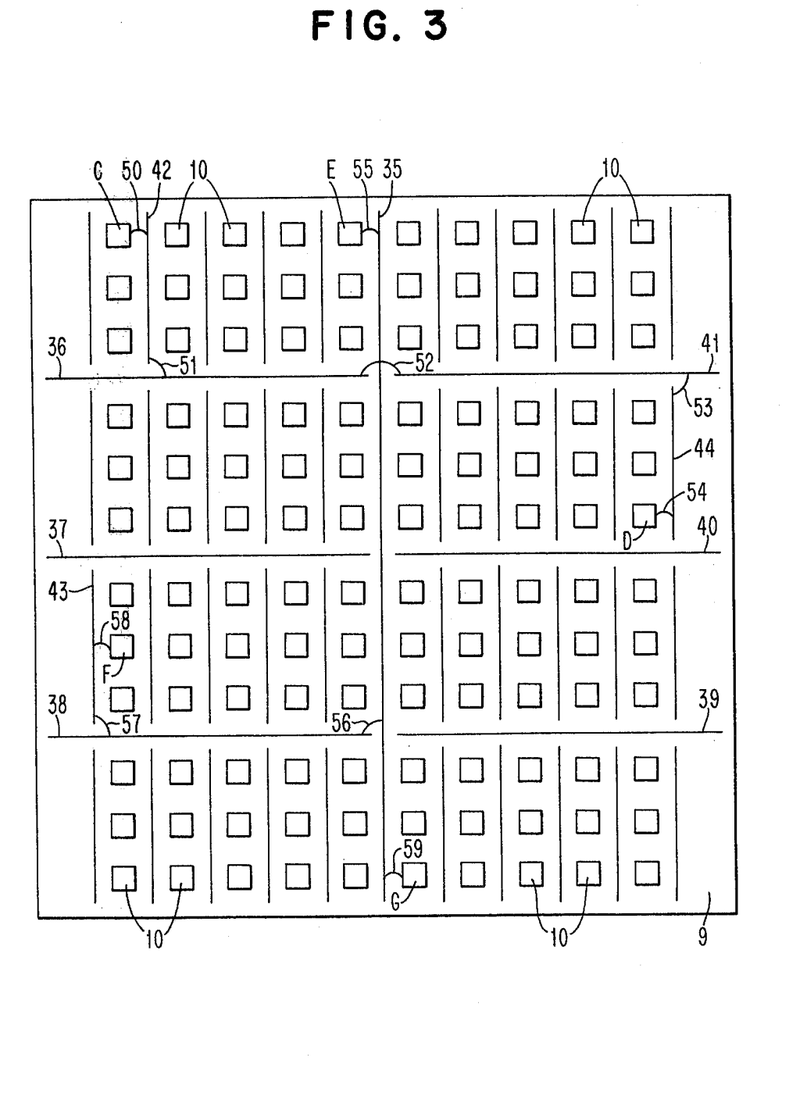
FIG. 3 shows an array of chips on a substrate with the general layout of the parallel interconnection lines between them illustrated by a single line in each case with the relative lengths illustrated plus the connections by fly wires to predetermined illustrative chips.

FIG. 3 shows the general interconnection line approach with a hierarchy of interconnection line lengths analogous to a superhighway, highway, local street approach to design. The higher hierarchy lines are quite long as in the case of EC lines 35. The next group of lines are shorter as in the case of EC lines 36, 37, 38, 39, 40 and 41. The remainder of the EC lines such as 42, 43 and 44 are shorter and analogous to local streets. It should be understood that the EC lines 35–44, etc. are all representative of sets of parallel lines (plus connection pads) which are represented in each case by a single line, for convenience of illustration. In the hierarchical approach, at intersections lines 36 and 41 yield to lines 35. Lines 37, 40, 38 and 39 also yield to lines 35. Chip C is connected by fly wire 50 and one of lines 42 to fly wire 51 to a line 36 which has a pad there (near line 42) between its ends. The line 36 is connected by fly wire 52 across lines 35 to line 41 to fly wire 53 to one of the lines 44 connected by fly wire 54 to chip D. Similarly, chip E is connected by fly wire 55 to one of the lines 35 and from there to fly wires 56 and 59. Fly wire 56 connects to a line 38 connected to a line 43 by fly wire 57. Fly wire 58 connects line 43 to chip F. Fly wire 59 connects the line 35 to chip G. The above description plus the connection arrangement in FIG. 1 are illustrative of numerous ways in which the present invention can be employed to facilitate the connection of engineering change pads on the periphery of chips.

Figure 4:
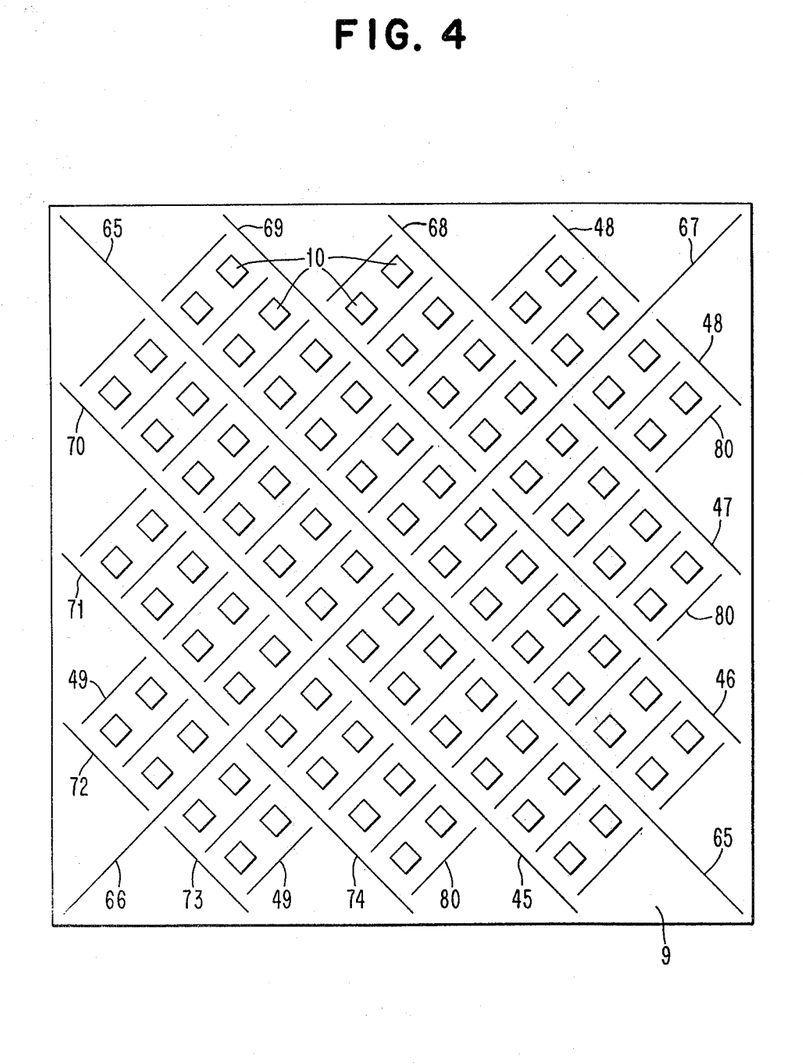
FIG. 4 is a modification of the arrangement of FIG. 3 with the chips arranged diagonally in arrays as in FIG. 1.
Figure 5A:
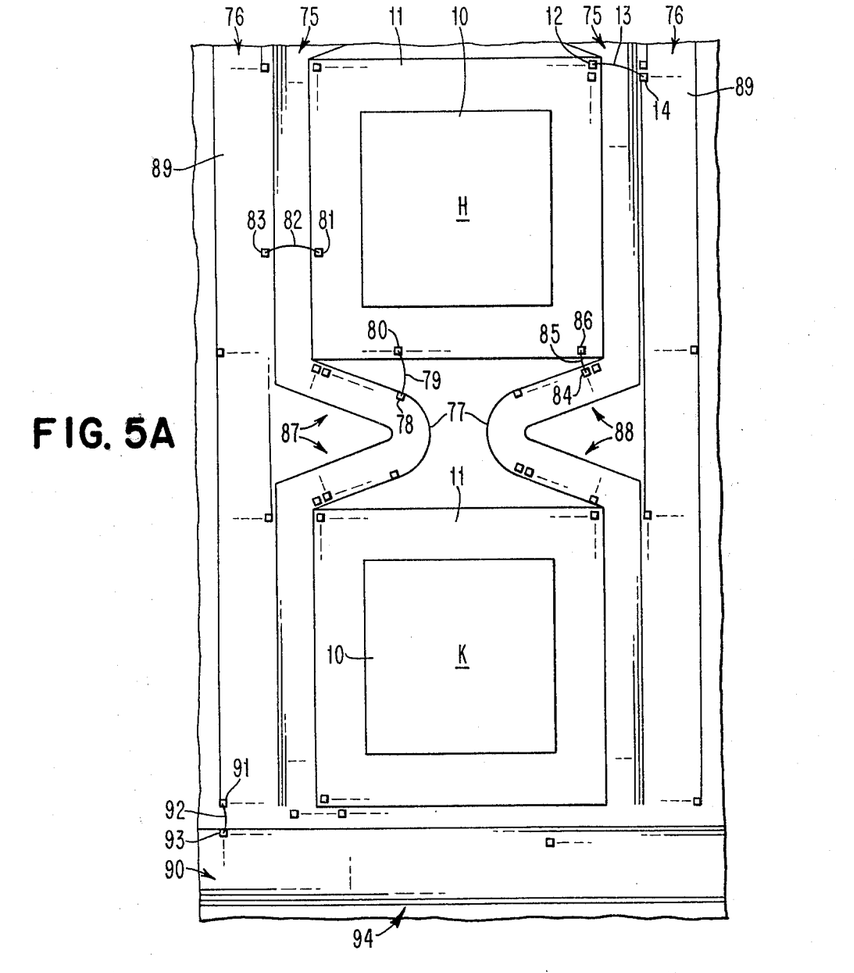

FIG. 4 shows a diagonal arrangement analogous to FIG. 3 but with the diagonal type of layout of chips shown in FIG. 1. The packaging substrate 9 includes chips 10 and the engineering change bundles with the highest order of the hierarchy being lines 65 followed by lines 66 and 67. The lines 69, 70, 45 and 46 follow by being shorter in length. Then lines 68, 71, 74 and 47 are still shorter bundles of lines. The shorter lines 48, 72 and 73 are the next to the lowest order in the hierarchy in terms of length. Finally, along each pair of chips there is a line 49 on at least one of the side of the chip 10. FIG. 5A shows a wasp waist arrangement of the local lower hierarchy engineering change lines 75, for chips H and K (10), with lines 75 side-by-side with longer distance engineering change lines 76. The wasp waists 77 of lines 75 permit shorter wires to have access to the tops and bottom of successive, peripheral fan-out areas 11 surrounding chips 10. For example, pad 78 on the waist 77 is connected to pad 80 on the peripheral area 11 by fly wire 79. Similarly, pad 84 on the other waist 77 is connected by fly wire 85 to pad 86 on the other end of the peripheral area 11.

Above, in the upper right hand corner of the peripheral area 11 is located pad 12 connected by fly wire 13 to pad 14 analogously to FIG. 1 with the exception that in this case the fly wire jumps over lines 75. On the left side of the peripheral area 11 is pad 81 which is connected by fly wire 82 to pad 83 in lines 76 which has a pad area 89 adjacent to chip 10 similarly to the pad areas 87 and 88 on the waist areas 77. There may be about forty EC lines in bundles 76 and twenty EC lines in bundles 75. The higher priority EC lines are lines 90 which may be as many as eightly in number and the pads 94 for wiring connections and fly wire connections to the chip fanout peripheral areas 11 are located there. A line 76 is connected by pad 91, fly wire 92 and pad 93 to one of the EC lines 90.

Figure 5B:
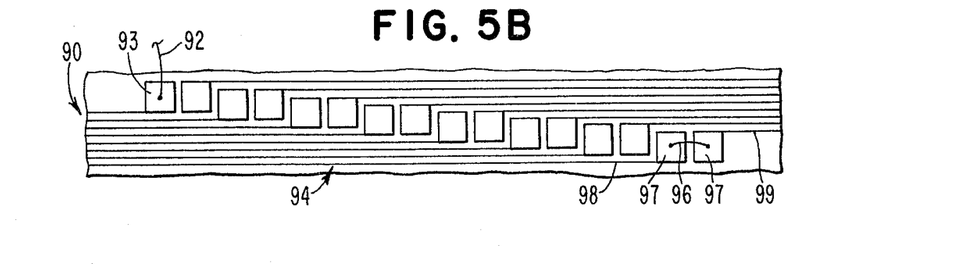
FIG. 5B shows the interconnection lines and the associated pads arranged in an end-to-end arrangement of pads with a diagonal arrangement which permits elimination of crossovers and which also conserves space.

FIG. 5B shows a bundle of EC lines 90 (reduced in number for convenience of illustration from eighty to about 9) with the pads 94 shown in more detail. Pad 93 is shown connected to fly wire 92, as in FIG. 5A. Fly wire 96 connects pads 97 on the ends of EC lines 98 and 99 together because it is desired to continue the continuity of the lines (98, 99) in bundle 90 beyond the pad area 94.

Figure 6:
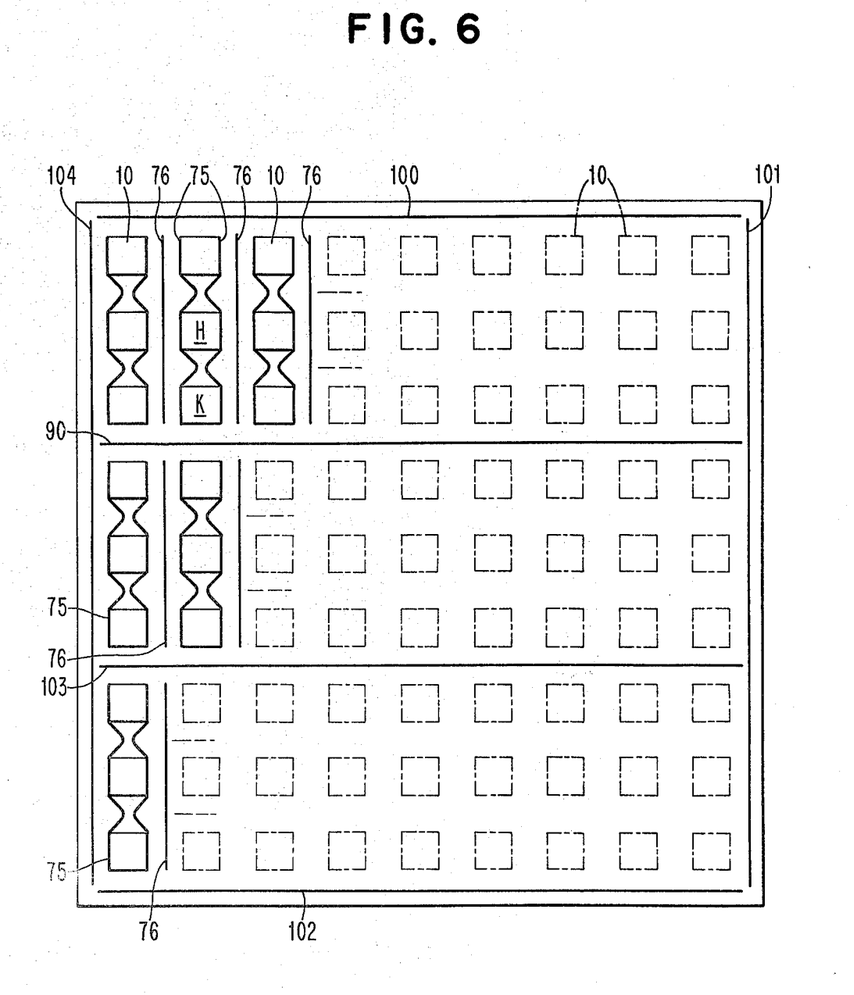
FIG. 6 shows a plan view of an overall wasp waist arrangement of engineering change wires as well as adjacent more direct interconnection lines on a primary and secondary distribution approach to connections.

FIG. 6 shows the general layout of a wasp waist connection system of the kind described in FIGS. 5A and 5B for an entire substrate. The bundles of EC lines and the pad areas about chips H and K are illustrated. The highest order EC lines are lines 100, 101, 103, 104 and of course, 90 which was shown in FIGS. 5A and 5B.

Industrial Applicability

This is a very promising approach to solving the problem of making engineering changes on modules upon which LSI chips are mounted. The use of fly wires and staggered pads which reduces the crossover of fly wires makes it feasible to have a single level of metallization for engineering change on the upper level of the module. The short fly wires introduce minimal inductive coupling. The staggered pads and parallel wires make it possible to connect any point on the module to any other point. There is the flexibility required for making discretionary, delayed changes which overcomes the fact that it cannot be predicted where such changes will be required. In this design there would be no engineering change wires below the upper surface of the module. This is for high chip density performance, high chip packaging modules where today's discrete wires have too much electrical coupling.

While I have illustrated and described the preferred embodiments of my invention, it is to be understood that I do not limit myself to the precise constructions herein disclosed and the right is reserved to all changes and modifications coming within the scope of the invention as defined in the appended claim.

Having thus described my invention, what I claim as new and desire to secure by letters patent is:

1. A module for an array of integrated circuit chips said module having an upper surface with a set of pads for connection thereto and a fan-out area with fan-out pads surrounding said chips and metallization beneath the surface providing standard connections between pads connected to said chips, said chips being arranged upon said module in a substantially orthogonal pattern upon said upper surface with engineering change metallization deposited upon said upper surface adjacent to said fan-out areas, the improvement comprising a plurality of generally either parallel or orthogonal engineering change lines adjacent to and between said chips and said fan-out pads upon said upper surface, said engineering change lines being arranged heirarchically with higher level and lower level lines, said higher level lines having the greater lengths and said lower level lines having the shorter lengths with successive levels of lines in said heirarchy generally being oriented orthogonally with respect to each other, with terminal pads located at one of the ends of said lower level lines and pads located upon said higher level lines adjacent to a juxtaposed terminal pad upon a lower level line with a fly wire connected between said juxtaposed pads and a fly wire bonded between a fan-out pad and another pad upon said lower level line for providing a connected between said fan-out pad and said higher level engineering change line, whereby engineering change connections are constructed upon the upper surface of a module with fly wire connections which are extremely short in order to minimize the space, bulk, resistance, and inductance of the fly wire connection and permit such engineering change interconnections to be made between different chips.

2. A module for an array of integrated circuit chips said module having an upper surface with a set of pads for connection thereto and a fan-out area with fan-out pads surrounding said chips and having metallization beneath said surface providing standard connections between pads connected to said chips, said chips being arranged upon said module in an orthogonal pattern, with engineering change metallization deposited upon said upper surface of said substrate adjacent to said fan-out areas, the improvement comprising providing in said metallization respectively a plurality of orthogonal and parallel engineering change lines adjacent to and between said chips and fan-out pads, said lines being hierarchically organized with the lowest nth order lines aligned substantially orthogonally to the next higher, n+1 order lines and terminating adjacent thereto in nth order terminal pads, where n is an integer greater than one, said nth order lines terminating in pads adjacent to said chips at one end and in said nth order terminal pads at the other end thereof, said n+1th order lines including corresponding pads juxtaposed immediately adjacent to said terminal pads, and a plurality of fly wires bonded to said fanout pads and said engineering change line pads and between said engineering change line terminal pads and said corresponding pads.

3. A module in accordance with claim 1 or 2 wherein said engineering change lines are arranged oriented in a plurality of directions with engineering change pads at the ends thereof and adjacent to the pads of other lines juxtaposed therewith.

4. A module in accordance with claim 1 or 2 wherein said engineering change lines bend to extend within the space between two adjacent chips with pads adjacent to the fan-out pads on the periphery of said chips.

5. A module in accordance with claim 1 or 2 wherein a gap between a pair of said lower level lines separated from each other by a said higher level engineering change line is bridged by means of a said fly wire.

6. A module in accordance with claim 1 or 2 wherein said engineering change lines are segmented and with the segmented ends thereof staggered with pads on the segmented ends thereof, whereby said staggered pads are juxtaposed in a diagonal arrangement whereby said segmented lines can be joined on a lengthwise basis or a chip joining basis or both as required.

7. A module in accordance with claim 1 or 2 wherein beneath the surface of said module electrical circuit wiring is provided connecting the chip pads together by means of vias and the direction of said circuit wiring is at an angle near 45° with respect to said engineering change wiring whereby electrical coupling is minimized.

8. A module for an array of integrated circuit chips having an upper surface with a set of pads for connection thereto and a fan-out area with fan-out pads surrounding said chips arranged upon said module in a substantially orthogonal pattern upon said upper surface and metallization beneath said upper surface for providing standard connections between pads connected to said chips, with engineering change metallization deposited upon said upper surface adjacent to said fan-out areas, the improvement comprising a plurality of parallel engineering change lines adjacent to and between said chips and said fan-out pads upon said upper surface, with said engineering change lines bending to extend within the space between two adjacent chips and including juxtaposed pads adjacent to said fan-out pads with fly wires connected between said fan-out pads and said juxtaposed pads on said engineering change lines.

9. A module for an array of integrated circuit chips having an upper surface with a set of pads for connection thereto and a fan-out area with fan-out pads surrounding said chips arranged upon said module in a substantially orthogonal pattern upon said upper surface and metallization beneath said upper surface for providing standard connections between pads connected to said chips, with engineering change metallization deposited upon said upper surface adjacent to and between said chips and said fan-out areas, the improvement comprising a plurality of engineering change lines adjacent to said fan-out areas upon said upper surface with said lines being segmented and with the segmented ends thereof being staggered in position with staggered pads on the segmented ends of said segmented ends of said lines, whereby said staggered pads are juxtaposed in a diagonal alignment and said staggered pads are adjacent to said fan-out pads and said staggered lines can be joined on a lengthwise basis by connecting corresponding staggered pads together.

* * * * *